(12) United States Patent
Basu et al.

(10) Patent No.: US 9,337,309 B1
(45) Date of Patent: May 10, 2016

(54) REDUCING DIRECT SOURCE-TO-DRAIN TUNNELING IN FIELD EFFECT TRANSISTORS WITH LOW EFFECTIVE MASS CHANNELS

(71) Applicant: International Business Machines Corporation, Armonk, NY (US)

(72) Inventors: Anirban Basu, Port Ewen, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/802,722

(22) Filed: Jul. 17, 2015

Related U.S. Application Data

(62) Division of application No. 14/550,350, filed on Nov. 21, 2014.

(51) Int. Cl.

| | | |
|---|---|---|
| H01L 29/88 | (2006.01) | |
| H01L 21/329 | (2006.01) | |
| H01L 29/74 | (2006.01) | |
| H01L 29/788 | (2006.01) | |
| H01L 21/336 | (2006.01) | |
| H01L 29/66 | (2006.01) | |

(Continued)

(52) U.S. Cl.
CPC ...... *H01L 29/66666* (2013.01); *H01L 29/1037* (2013.01); *H01L 29/1054* (2013.01); *H01L 29/16* (2013.01); *H01L 29/20* (2013.01); *H01L 29/41741* (2013.01); *H01L 29/6656* (2013.01); *H01L 29/66522* (2013.01)

(58) Field of Classification Search
CPC ............ H01L 29/0603; H01L 29/7783; H01L 33/007; H01L 21/0237; H01L 21/02458; B82Y 20/00
USPC ............. 257/138, 280, 286; 438/47, 488, 143
See application file for complete search history.

(56) References Cited

U.S. PATENT DOCUMENTS

| | | | |
|---|---|---|---|
| 5,880,500 A | 3/1999 | Iwata et al. | |
| 6,034,386 A * | 3/2000 | Ando | H01L 29/7783 257/280 |

(Continued)

FOREIGN PATENT DOCUMENTS

| | | |
|---|---|---|
| JP | 63-78572 A | 4/1988 |
| JP | 2-18940 A | 1/1990 |

(Continued)

OTHER PUBLICATIONS

U.S. Appl. No. 14/550,350, filed Nov. 21, 2014.

(Continued)

*Primary Examiner* — Kimberly Rizkallah
*Assistant Examiner* — Brian Turner
(74) *Attorney, Agent, or Firm* — Maeve M. Carpenter

(57) ABSTRACT

An approach to providing a barrier in a vertical field effect transistor with low effective mass channel materials wherein the forming of the barrier includes forming a first source/drain contact on a semiconductor substrate and forming a channel with a first channel layer on the first source/drain contact. The approach further includes forming the barrier on the first channel layer, and a second channel layer on the barrier followed by forming a second source/drain contact on the second channel layer.

6 Claims, 10 Drawing Sheets

(51) Int. Cl.
*H01L 29/417* (2006.01)
*H01L 29/10* (2006.01)
*H01L 29/16* (2006.01)
*H01L 29/20* (2006.01)

(56) References Cited

U.S. PATENT DOCUMENTS

| | | |
|---|---|---|
| 6,297,114 B1 | 10/2001 | Iwata et al. |
| 6,943,407 B2 | 9/2005 | Ouyang et al. |
| 8,026,132 B2 | 9/2011 | Sandhu et al. |
| 8,324,017 B2 | 12/2012 | Han |
| 2007/0148939 A1 | 6/2007 | Chu et al. |
| 2011/0086498 A1 | 4/2011 | Cheng et al. |
| 2011/0300682 A1 | 12/2011 | Lue |
| 2012/0043607 A1 | 2/2012 | Luisier et al. |
| 2013/0075806 A1 | 3/2013 | Lue et al. |

FOREIGN PATENT DOCUMENTS

| | | |
|---|---|---|
| JP | 8-78685 A | 3/1996 |
| JP | 2004296518 A | 10/2004 |

OTHER PUBLICATIONS

List of IBM Patents or Patent Applications Treated as Related (Appendix P), filed herewith.
U.S. Appl. No. 14/931,930, filed Nov. 4, 2015.
Appendix P.: List of IBM Patents or Patent Applications Treated as Related, Filed Herewith, 2 pages.

* cited by examiner

REDUCING DIRECT SOURCE-TO-DRAIN TUNNELING IN FIELD EFFECT TRANSISTORS WITH LOW EFFECTIVE MASS CHANNELS

BACKGROUND OF THE INVENTION

The present invention relates generally to the field of semiconductor technology, and more particularly to reducing direct source to drain tunneling in field effect transistors with low effective mass channels.

Semiconductor device scaling to smaller feature sizes is facing significant challenges, such as increases in power consumption as increasing OFF-state leakage and non-scalability of the operating voltage, in pursuit of faster device performance. Traditional semiconductor design techniques, processes and materials become ineffective as physical dimensions shrink down to the nanometer regime. Increasing use of low effective mass semiconductor materials provide an increase in the maximum obtainable velocity of charge carriers such as electrons and holes. The effective mass is the mass an electron or a hole appears to have when in a solid material. The effective mass of electrons and holes in semiconducting materials, in general, is lower than the mass of a free electron. The effective mass, in some cases, may be considered a constant of a material, however, in general, the value of the effective mass depends on the application where it is used. The effective mass may be used in transport calculations, such as the transport of electrons under the influence of electric fields or carrier gradients.

Group III-V semiconductor materials provide smaller effective mass than group IV semiconductor materials and are thus, desirable for increasing performance due to a corresponding increase in electron velocity associated with lower effective mass. Group IV and group III-V refers to the location of the semiconductor element in a column of the periodic table of the elements. A group of semiconductor elements generally share similar characteristics, for example, similar physical and electrical characteristics of the outermost shell of electrons. A group III-V semiconductor is a semiconductor material that includes at least one element or semiconductor material from group III and at least one element or semiconductor material from group V of the periodic table of the elements. Group III-V semiconductor materials see increasing use in high performance semiconductor devices, particularly, in the nanometer regime.

In addition, as thinner layers are desired in the nanometer regime, an increase in electron tunneling occurs between the channel, often using III-V semiconductor materials with low effective mass, and the gate. High-k dielectric materials such as group IVb metal silicates, including hafnium and zirconium silicates and oxides, are commonly being used to reduce leakage due to electron tunneling in applications for less than fifty nanometers.

In further efforts to improve device and semiconductor material performance in the nanometer regime, bandgap engineering has been utilized. In solid-state physics, a bandgap is an energy range in a solid wherein electron states can exist. In general for semiconductor chips, bandgap refers to the energy difference (in electron volts) between the top of the valence band and the bottom of the conduction band in insulator materials and in semiconductor materials. The bandgap is equivalent to the energy required to free an outer shell electron from its orbit about the nucleus to become a mobile charge carrier, able to move freely within the solid material and thus, is a major factor in determining the electrical conductivity of a semiconductor material. Bandgap engineering is the process of controlling or altering the bandgap of a material by controlling the composition of semiconductor alloys such as group III-V semiconductor materials. Group III-V semiconductor materials such as some alloys of GaAlAs, InGaAs, and InAlAs are often employed in bandgap engineering for advanced or nanometer regime devices. Bandgap engineering includes constructing layered semiconductor materials with alternating semiconductor compositions using techniques such as molecular beam epitaxy and metal-organic chemical vapor deposition.

SUMMARY

Embodiments of the present invention provide a method of forming a barrier in a vertical field effect transistor with low effective mass channel materials. The method includes forming a first source/drain contact on a semiconductor substrate. Additionally, the method includes forming a channel with a first channel layer on the first source/drain contact, a barrier on the first channel layer, and a second channel layer on the barrier, and, then, forming a second source/drain contact on the second channel layer.

DETAILED DESCRIPTION

Figure 1A:
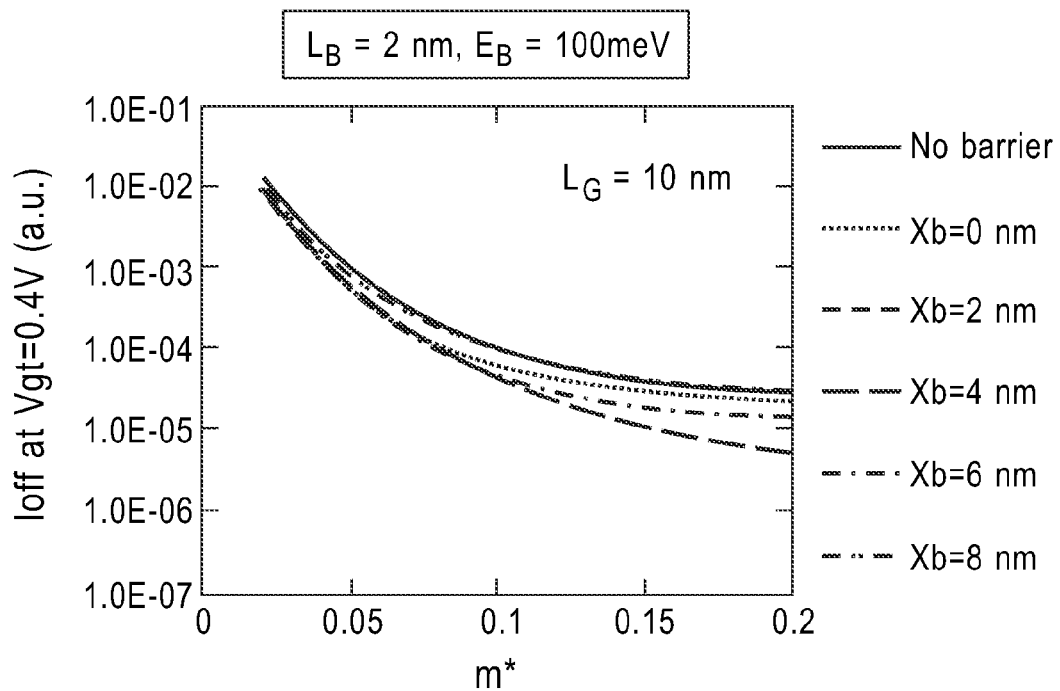
FIGS. 1(a), (b), and (c) depict device modeling results for a vertical FET with low effective mass channel materials, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be mentioned at all. It should be understood that the following description is focused on the distinctive features or elements of the various embodiments of the present invention.

New device engineering is indispensable in overcoming difficulties of advanced metal-oxide-semiconductor field effect transistors (MOSFETs) and realizing high performance large scale integrations under, for example, the 10 nm gate-length regime. In addition to the improvements of gate stacks using metal gate/high-k gate dielectrics, new channel materials with enhanced carrier transport properties are needed for enhancing the performance of MOSFET circuits and chips. Embodiments of the present invention, recognize that n-channel field effect transistors (NFETs) with group III-V semiconductor channels are considered a compelling candidate for extending the device scaling limits of low-power and high-speed circuit operation, owing to their enhanced carrier transport properties compared to those of silicon (Si). Similarly, silicon-germanium (hereinafter "SiGe") p-channel FETs (PFETs) are also considered a compelling candidate for low power and high speed circuit operation in light of their improved hole transport properties compared to those in Si. Additionally, a vertical FET structure is commonly used with nanowires and in the nanometer regime, in part, to reduce lattice and thermal expansion mismatch between group III-V semiconductors and silicon reducing the contact area between group III-V semiconductor material and silicon. Vertical FET structures include source/drain contacts which reside above and below a channel in the FET. As known to one skilled in the art, in FET such as MOSFET devices, a source contact may be used as a drain contact and vice versa depending on device operation and for this reason, in embodiments of the present invention, the source contact and the drain contact are referred to as source/drain contacts.

Embodiments of the present invention recognize that FETs with low effective mass channel materials can outperform traditional silicon based FETs due to higher effective velocity in spite of lower gate capacitance. However, at short gate lengths (e.g. short $L_g$), low effective mass materials lead to high source to drain (S/D) tunneling current that increases OFF-state current, $I_{off}$. $I_{off}$ for FET devices has three components: classical thermionic emission effected by barrier height, direct source-to-drain tunneling effected by barrier height and electron effective mass, and band-to-band tunneling (gate induced drain leakage or GIDL) effected by bandgap and effective mass. $I_{off}$ increases at smaller effective mass, smaller bandgap (e.g. smaller $E_g$), and shorter gate length (e.g. shorter $L_g$) due to increases in direct S/D tunneling and increases in band-to-band tunneling. Modeling results have shown that for a bandgap approximately greater than 0.7 eV (i.e. $E_g$ greater than or equal to 0.7 eV) with channel widths in the five to ten nm range, $I_{off}$ is not limited by GIDL or band-to-band tunneling, but $I_{off}$ is limited by direct S/D tunneling.

Embodiments of the present invention include structures and methods to form FET devices with low effective mass materials to lower S/D current and lower $I_{off}$. Using bandgap engineering principles and the semiconductor material properties including electron affinity for NFETs or bandgap and electron affinity for PFETs, a barrier layer is used in embodiments of the present invention to reduce leakage when the FET is in an off-state. The barrier layer provides an additional potential energy barrier for charge carriers. Electron affinity is the energy required to extract an electron from the bottom of the conduction band just inside the semiconductor to the vacuum just outside of the semiconductor. Thus, for NFETs, the barrier layer must have lower electron affinity than the other channel materials. For PFETs, the barrier layer must have a larger sum of bandgap and electron affinity than the other channel materials in order to act as a barrier. In general, both these conditions (e.g. low electron affinity in NFET and larger sum of bandgap and electron affinity in PFET) may be satisfied by larger bandgap materials. Therefore, in general, for the purposes of the embodiments of the present invention, the barrier layer may be considered as the layer with a larger bandgap and utilizing larger bandgap materials.

Embodiments of the present invention further recognize significant reductions in $I_{off}$ may be achieved by inserting a barrier layer to reduce direct S/D tunneling. As will be illustrated and discussed relative to the Figures, and with device modeling calculations of $I_{off}$, the barrier layer, due to the wider bandgap, provides a larger barrier height than the other channel semiconductor materials and, thus reduces direct S/D tunneling and $I_{off}$. Additionally, device modeling calculations of $I_{off}$ show that a thicker barrier results in larger $I_{off}$ reductions. Furthermore, the device modeling calculations show that the placement of the barrier impacts $I_{off}$. The device modeling calculations illustrate that a barrier placed in the middle of the channel provides the largest reduction in $I_{off}$. Barrier placement in the middle of the channel is most effective since the top of the barrier which limits $I_{off}$ occurs near the middle of the channel in an electrostatically well-tempered FET.

FIGS. 1(a), (b), and (c) depict device modeling results for a vertical FET with low effective mass channel materials. The device modeling results plot $I_{off}$ versus the effective mass, m*, at a gate voltage $V_{gt}$=−0.4 V, where $V_{gt}$ is the gate under-drive for OFF-state leakage and arbitrary units are used for $I_{off}$. The effective mass, m*, may be stated as units of the mass of the free electrons, $m_o$ (e.g. 9.11×10$^{-31}$ kg). The FET has a gate length of 10 nm ($L_g$=10 nm) in each of FIGS. 1(a), (b), and (c) wherein the gate length according to standard simulation practice is the electric gate length or the length of the gate that is approximately equal to the length of the channel it is associated with. $X_b$ is the distance of the closest edge of the barrier to the source in nm. A series of curves are generated in each graph of $I_{off}$ versus effective mass for a range of distances of the barrier to the sources, or various $X_b$.

In the first graph, FIG. 1(a), the length of the barrier, $L_B$, is set at 2 nm and the additional barrier height, $E_B$, is set at 100 meV. The series of curves for $I_{off}$ versus effective mass are generated for various $X_b$ distances. The first graph illustrates that with $L_B$ of 2 nm and $E_B$ of 100 meV, an $X_b$ equal to 4 nm provides the lowest values for $I_{off}$. $X_b$ of 4 nm with a 2 nm long barrier would center the barrier in the middle of a 10 nm channel.

Figure 1B:
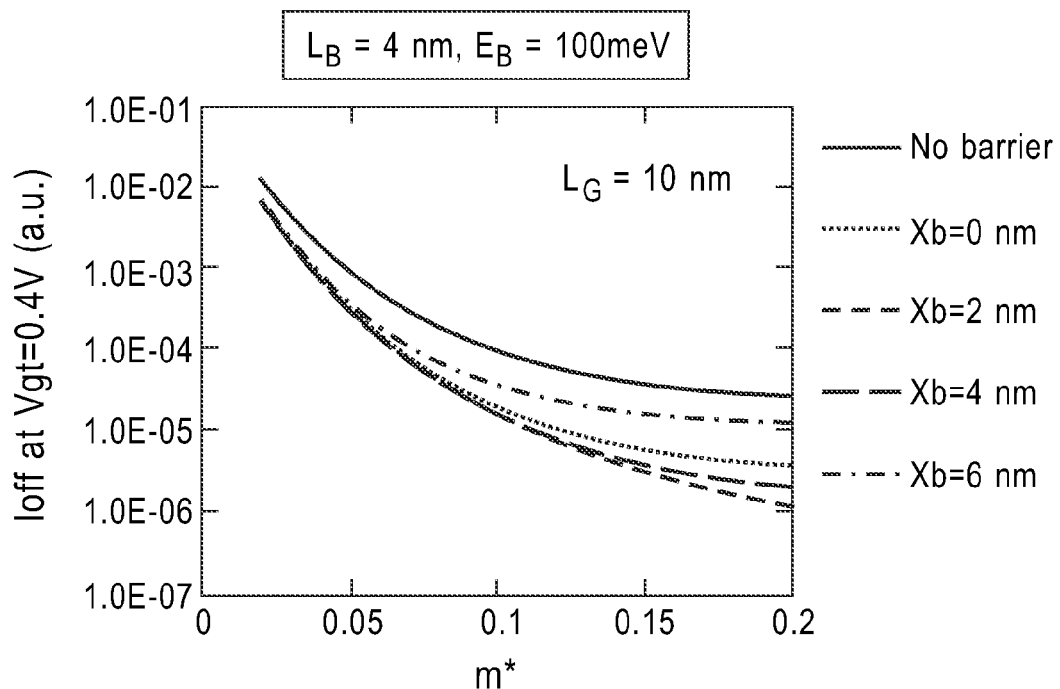

In the second graph, FIG. 1(b), the additional barrier height, $E_B$, remains the same at 100 meV and the length of the barrier, $L_B$, is extended to 4 nm for a channel length of 10 nm. In this graph, another series of curves are generated for $I_{off}$ versus effective mass for various values of $X_b$. The second graph illustrates that $X_b$ of 2 nm and $X_b$ of 4 nm provide the lowest $I_{off}$. Additionally, $X_b$ of 2 nm and $X_b$ of 4 nm are both approximately 1 nm from the center of the channel. An $X_b$ of 3 nm would put the 4 nm barrier length in the center of a 10 nm channel. Furthermore, the second graph illustrates that a longer barrier (i.e. 4 nm) placed in the center of a 10 nm channel with the same $E_B$ provides a lower $I_{off}$ than a thinner barrier (i.e. 2 nm) in the first graph (a).

Figure 1C:
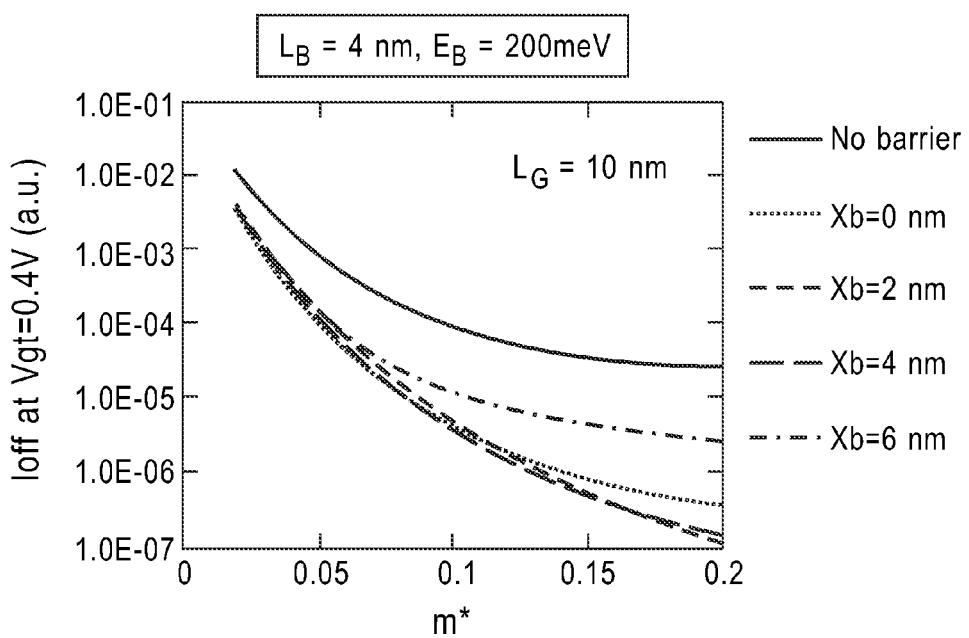

In the third graph, FIG. 1(c), the length of the barrier, $L_B$ is 4 nm and the additional barrier height, $E_B$ is increased to 200 meV. The channel length remains 10 nm. In this graph, another series of curves are generated for $I_{off}$ versus effective mass for various values of $X_b$. The third graph illustrates that $X_b$ of 2 nm and $X_b$ of 4 nm provide the lowest $I_{off}$ just like the second graph since an $X_b$ of 3 nm would be the center of the channel and $X_b$ of 2 nm and 4 nm are just on either side of the center of the channel. Furthermore, the third graph illustrates that a 4 nm barrier placed in the center of a 10 nm channel having a larger additional barrier height (due to larger bandgap) provides a lower $I_{off}$ than a barrier having a lower additional barrier height (due to lower bandgap) as depicted in the second graph (b).

The device modeling calculations of $I_{off}$ versus effective mass show that a thicker barrier reduces $I_{off}$. The device modeling calculations also show a barrier with a larger bandgap (which has a larger additional barrier height, $E_B$) reduces $I_{off}$. Additionally, the device modeling calculations depicted in FIGS. 1(a), (b), and (c) show that the placement of the barrier in the center of the channel provides the largest reduction in $I_{off}$ for all corresponding data points modeled, that is, for each barrier length and for each bandgap, a barrier in the center of the channel provides the lowest $I_{off}$.

Figure 2:
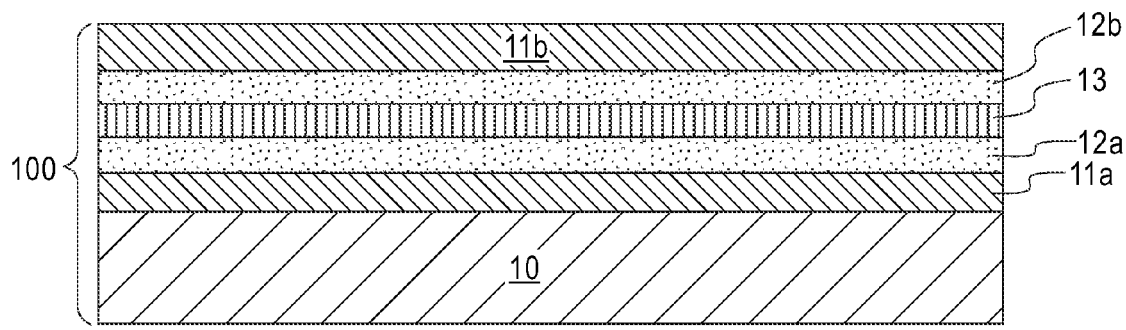
FIG. 2 depicts a cross-sectional view of a wafer after fabrication steps to form semiconductor layers on a semiconductor substrate in accordance with an embodiment of the present invention.

FIG. 2 depicts a cross-sectional view of wafer 100 after fabrication steps to form semiconductor layers on a semiconductor substrate in accordance with an embodiment of the present invention. Wafer 100 includes layers 10, 11a, 11b, 12a, 12b, and 13.

Layer 10 may be a semiconductor substrate layer. In the exemplary embodiment, layer 10 is composed of a silicon material. In other embodiments, layer 10 may be composed of any other semiconductor material including, for example, SiGe, SiGeC, SiC, Ge alloys, Ga, GaAs, InAs, InP, or other III-V compound semiconductor materials. Layer 10 may be doped, undoped, or contain doped or undoped regions or, may be a layered semiconductor substrate such as a semiconductor-on-insulator substrate. Layer 10 may be strained, unstrained or be a combination thereof.

Layer 11a and layer 11b may be heavily-doped source/drain layers. Layer 11a and layer 11b may be composed of a first semiconductor layer material with the same doping polarity as the device polarity. For example, a NFET may be doped with an n-type doping material such as silicon, tellurium, selenium, or other n-type doping material suitable for III-V NFETs. A PFET may be doped with a p-type doping material such as boron or other p-type material suitable for SiGe PFETs. The first semiconductor material used in layer 11a and 11b may be doped using conventional methods such as ion implantation or may be incorporated as a part of the epitaxial growth process (e.g. MBE or MOCVD). Layer 11a and layer 11b may form a first source/drain contact and a second source/drain contact respectively.

Layer 11a and layer 11b may be composed of a first semiconductor material which may be a group IV semiconductor or a group III-V semiconductor material. A group IV semiconductor material, or in modern chemistry standardization terms, as provided by the International Union of Pure and Applied Chemistry (IUPAC), a group 14 element, refers to the location of the semiconductor element in a column of the Periodic Table of Elements. For the purposes of the present invention, location of elements or semiconductor materials, will utilize the traditional group designation for semiconductors (e.g. Group III, Group IV, Group V and Group III-V) rather than the IUPAC group designation. In embodiments of the present invention, a group III-V semiconductor material, referred to as an "III-V semiconductor material" hereafter, denotes a semiconductor material that includes at least one element or material from group III and at least one element or material from group V of the Periodic Table of Elements.

Typically, each of the III-V semiconductor layers may be a binary, a ternary, or a quaternary III-V containing compound. Examples of III-V compound semiconductors that may be used include, but, are not limited to alloys of InGaAs, AlGaAs, InAlAs, InAlAsSb, InAlAsP and InGaAsP.

In an embodiment of the present invention, layers 11a and 11b may be composed of III-V semiconductor materials in a NFET. For example, layers 11a and 11b may be composed of GaAs or InAs or an alloy of InGaAs in a NFET. In another embodiment, layers 11a and 11b are composed of SiGe or another semiconductor material such as a Group IV semiconductor material (e.g. Ge) in a PFET.

Typically, III-V semiconductor materials used in the embodiments of the present invention, may be produced or deposited using epitaxial growth processes known to one skilled in the art, for example, atomic layer deposition (ALD), molecular beam epitaxy (MBE) or metal-organic chemical vapor deposition (MOCVD) although other deposition methods may be used in some embodiments. The semiconductor materials used in semiconductor layers 11a, 11b, 12a, 12b and 13 in wafer 100 may be formed as single crystal III-V semiconductor layer, single crystal IV semiconductor layer, or other suitable semiconductor layer with low defect density (less than $10^5$ defects/$cm^2$).

Layer 11a and layer 11b are not deposited in an immediate sequence, but, as depicted in FIG. 2 (i.e. layer 11a is deposited on layer 10 and layer 11b is deposited on layer 12b, which is deposited on layer 13). In the exemplary embodiment, layer 11a and layer 11b are depicted with approximately the same thickness, however, in other embodiments, layer 11a and layer 11b may have different thicknesses. In one embodiment, the thickness of layers 11a and 11b are in the range of 10 nm to 50 nm, but, are not limited to this thickness in other embodiments.

Layer 12a may be deposited using known deposition methods such as ALD, MBE, MOCVD, or other appropriate deposition method on layer 11a while layer 12b may be similarly deposited on layer 13. Layer 12a and 12b form first channel layers which may be composed of a low bandgap semiconductor material which may have a smaller bandgap than the bandgap of layer 13 (i.e. barrier layer). As previously discussed, the term "bandgap" refers to the energy difference between the top of the valence band and the bottom of the conduction band (i.e. expressed in units of eV). Layer 12a and layer 12b may be composed of GaAs or InAs or an alloy of InGaAs in a NFET, for example. Layer 12a and 12b may be composed of SiGe or another semiconductor material such as a Group IV semiconductor material (e.g. Ge) for example, in a PFET. In one embodiment, the second semiconductor material in layer 12a and 12b may be the same as the first semiconductor material in layers 11a and 11b.

In an embodiment, layer 12a and layer 12b are composed of a second semiconductor material with a bandgap that may be the same as the bandgap of the first semiconductor material. In another embodiment, the bandgap of the second semiconductor material in layers 12a and 12b is less than the bandgap for the first semiconductor material of layer 11a and 11b, which form the source/drain contacts. In one embodiment, the bandgap of the second semiconductor material of layers 12a and 12b is in the range of 0.3 eV to 1 eV. In an exemplary embodiment, the second semiconductor material in layer 12a and 12b is an alloy of InGaAs for NFETs and SiGe for PFETs. In another embodiment, layer 12a and 12b may be composed of at one of the following semiconductor materials: GaAs, InAs, AlGaAs, InAlAs, InAlAsSb, InAlAsP and InGaAsP for NFETs, and Ge for PFETs, or another semiconductor material.

Layer 12a and layer 12b forming the first channel layers may be doped or undoped. Layer 12a and 12b may doped in-situ during epitaxial growth or using ion plantation, for example. In an exemplary embodiment, the semiconductor material of layer 12a and layer 12b may be doped using the same doping material as the channel doping material consistent with the FET type doping (i.e. NFET or PFET channel doping materials). In an embodiment, layer 12a and layer 12b is doped with a p-type doping material such as zinc in an III-V semiconductor material for a NFET. In another embodiment, layer 12a and layer 12b is doped with an n-type doping material such as arsenic or phosphorous for a SiGe PFET. In one embodiment, the second semiconductor material in layer 12a and layer 12b may be undoped. The first channel layers formed from layer 12a and 12b have low carrier effective mass, which will lead to higher carrier velocities and therefore, higher ON-state currents.

In an exemplary embodiment, layer 12a and layer 12b may have a thickness range of 2 nm to 20 nm. In other embodiments, the thickness of layers 12a and 12b, the first channel layer, may have a different minimum thickness and/or a different maximum thickness for each of layer 12a and layer 12b. In the exemplary embodiment, layer 12a and layer 12b are depicted with approximately the same thickness.

Layer 13 is composed of a barrier semiconductor material. Layer 13 acts as a barrier layer in the channel and reduces $I_{off}$ of the FET device. Layer 13 may be composed of a barrier semiconductor material which is a different semiconductor material than the first semiconductor material, layers 11a and 11b, and the second semiconductor material, layers 12a and 12b. Layer 13 may be doped or undoped. In one embodiment, layer 13 is undoped and may be composed of a barrier semiconductor material with a greater bandgap than the second semiconductor material. In another embodiment, layer 13 which acts a barrier layer may be doped. The doping material is consistent with the channel doping material for the FET application. For example, a NFET is doped with a p-type doping material used in III-V semiconductor materials, for example, zinc and a PFET is doped with an n-type doping material such as arsenic or phosphorous. Doping of layer 13 may be done with suitable processes such as ion implantation or an in-situ doping process where the doping atoms may be added during the initial semiconductor layer formation (e.g. during epitaxial growth).

The barrier semiconductor material which composes layer 13 may be selected according to the FET type. In one embodiment, an NFET may use a first barrier semiconductor material in the barrier layer (i.e. layer 13) with an electron affinity that is less than the electron affinity of the second semiconductor material used in layers 12a and 12b, the first channel layers. The typical electron affinity of the third semiconductor in a NFET may be in the range of 3.5 eV to 5 eV, but, not limited to this range. In an exemplary embodiment, the third semiconductor material in layer 13 for an NFET is InAlAs. In another embodiment, other semiconductor materials such as GaAs, alloys of AlGaAs, alloys of InGaAs, another III-V semiconductor material, or other suitable semiconductor material may be used for layer 13. In the exemplary embodiment, the third semiconductor material, InAlAs for an NFET, may be undoped. In another embodiment, the third semiconductor material for an NFET is doped with doping material appropriate for a NFET. For example, a p-type doping material such as with zinc may be used in a NFET doping layer 13. The doping concentration for layer 13, the barrier layer, is typically in the range of $10^{16}$ $cm^{-3}$ to $10^{18}$ $cm^{-3}$.

In another embodiment, the FET is a PFET using a second barrier semiconductor material (i.e. layer 13) with a combined electron affinity and bandgap that is greater than the combined electron affinity and bandgap of the second semiconductor material used in layers 12a and 12b (i.e. the first channel layer). Layer 13 may be composed of a group IV semiconductor material or a group IV semiconductor compound material for a PFET in an embodiment. In one embodiment, the third semiconductor material in a PFET may be undoped Si. In another embodiment, the third semiconductor of layer 13 is SiGe with high Si content and the second semiconductor material such as SiGe with high Ge content or Ge. In another embodiment, layer 13 may be doped with n-type doping concentration in the range of $10^{16}$ cm$^3$ to $10^{18}$ cm$^3$.

In an exemplary embodiment, layer 13 may have a thickness in the range of 2 nm to 10 nm. The thickness of layer 13 corresponds to the length of the barrier, $L_B$ in FIGS. 1(a), 1(b), and 1(c) where, as shown in FIGS. 1(a) and 1(b), a thicker barrier layer may result in a reduction of $I_{off}$. An example of a barrier thickness, for a gate length of 10 nm, may be 4 nm which corresponds to a 4 nm thickness for layer 13. While an exemplary embodiment of the present invention utilizes an III-V semiconductor material for layer 13 in an NFET, the semiconductor material should not be limited to III-V semiconductor materials but, may use another high band gap semiconductor material. The high bandgap semiconductor material used in layer 13 acts as barrier reducing Ioft in a channel composed of low effective mass semiconductor materials.

In an exemplary embodiment, layer 13 resides midway between layers 11a and 11b and, ideally, is equidistant from the closest surface of layer 11a (i.e. source layer) and the closest surface of layer 11b (i.e. drain layer). Layer 13 functions most effectively as a barrier layer to reduce loft in the semiconductor device illustrated in FIG. 1(a) when layer 13 (i.e. the barrier layer) is located approximately in the middle of the channel in an electrostatically well-tempered or well-modulated FET device.

Figure 3:
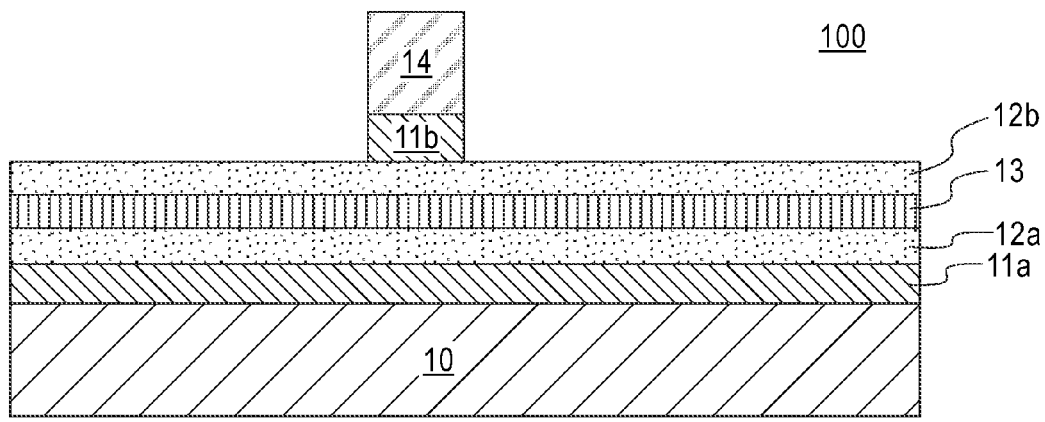
FIG. 3 depicts a cross-sectional view of the wafer after fabrication steps to pattern a source/drain layer in accordance with an embodiment of the present invention.

FIG. 3 depicts a cross-sectional view of the wafer after fabrication steps to pattern a source/drain layer in accordance with an embodiment of the present invention. As depicted, FIG. 3 includes layer 10, layer 11a, layer 12a, layer 13, layer 12b, layer 11b, and layer 14. A layer of a first dielectric material, layer 14, may be deposited on layer 11b using known deposition methods, for example, chemical vapor deposition (CVD) or atomic layer deposition (ALD). Layer 14 is composed of a first dielectric material, for example, SiN, SiO2, SiON, other oxide compound, nitride compound, or other dielectric material similarly used in semiconductor device formation. Known lithography processes may be used to pattern layer 14. Layer 14 and layer 11b may be etched, stopping at the top of layer 12a and resist stripped. Layer 14 and layer 11b may be etched using known etch processes such as one or more appropriate chemical etch processes for the dielectric material and the semiconductor material, a reactive ion etch (RIE), or another suitable etch process. Selectively defined, layer 14 may be used as a chemical mechanical polish (CMP) stop layer in later processes. In an embodiment, a hard mask layer (not shown) such as, but not limited to SiN, may be deposited on layer 14. Upon completion of etch, layer 14 and layer 11b form a circular pillar or column on the surface of layer 12b. While the exemplary embodiment creates a pillar with layers 11b and 14, in other embodiments another shape such as a rectangular or square column may be created. Layer 11b forms a contact or a source/drain contact.

Figure 4:
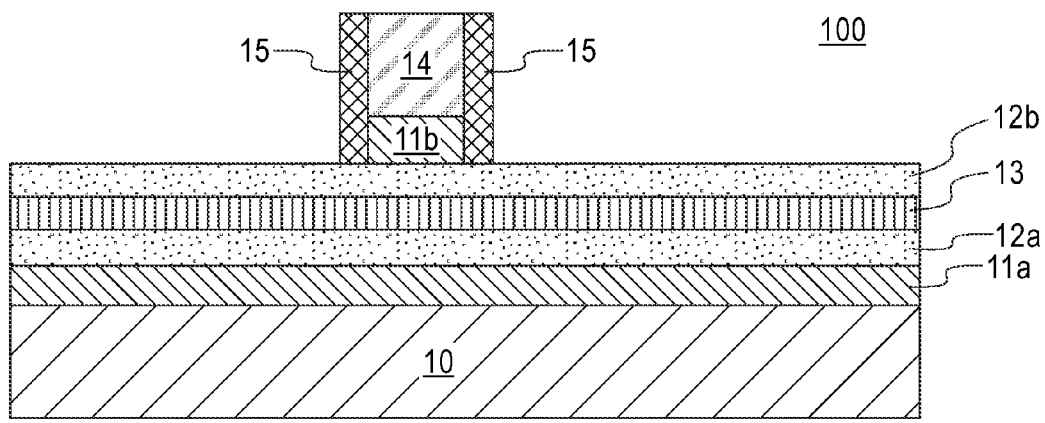
FIG. 4 depicts a cross-sectional view of the wafer after fabrication steps to form a first spacer in accordance with an embodiment of the present invention.

FIG. 4 depicts a cross-sectional view of the wafer after fabrication steps to form a first spacer in accordance with an embodiment of the present invention. A second dielectric layer, layer 15 may be deposited with known deposition methods such as CVD or ALD on the surface layer 12b. In an embodiment, layer 15 may be deposited in a conformal layer. The second dielectric material of layer 15 may be, for example, any dielectric material suitable for forming a spacer in a FET. However, the second dielectric material in layer 15 is different than the first dielectric material in layer 14. In an embodiment, the second dielectric material may be SiN or another nitride compound dielectric. In another embodiment, an oxide, for example, SiO$_2$ may be used for the second dielectric material. Using an anisotropic etch process, for example, an anisotropic wet etch or RIE, layer 15 may be selectively patterned, removing the dielectric material from horizontal surfaces. Layer 15 forms a first spacer. In the depicted embodiment, layer 15 may be formed around the pillar created from layer 11b (i.e. source/drain contact) and layer 14. Upon completion of the etch process, layer 15 forms a ring around the pillar created from layers 11b and 14. In the exemplary embodiment, the ring thickness may be in a range of 5 nm to approximately 50 nm. The thickness range and the shape of the first spacer (i.e. layer 15) may be different in other embodiments. For example, the first spacer formed from layer 15 may be less than 5 nm in another embodiment. In one embodiment the spacer may have a different shape, for example, may create a square box around a pillar of layer 11b and layer 14.

Figure 5:
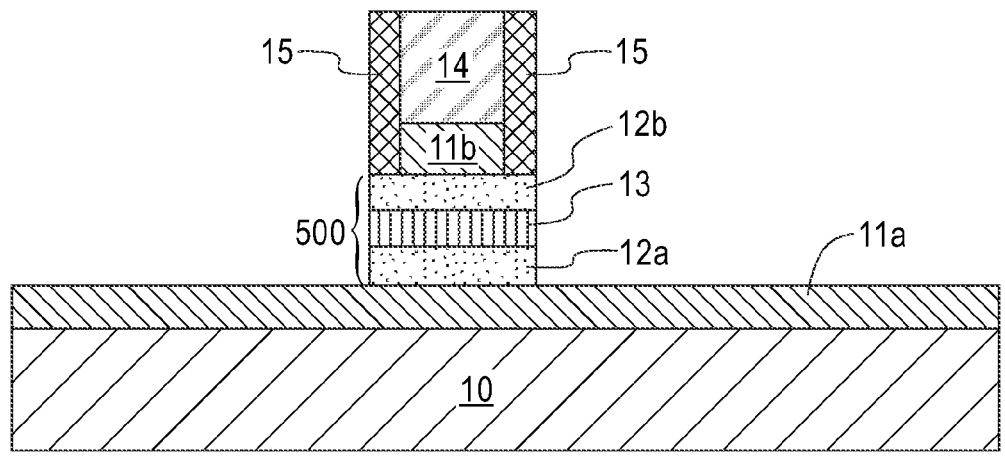
FIG. 5 depicts a cross-sectional view of the wafer after fabrication steps to form a channel in accordance with an embodiment of the present invention.

FIG. 5 depicts a cross-sectional view of the wafer after fabrication steps to form channel 500 in accordance with an embodiment of the present invention. Using the patterned first dielectric material of layer 14 which may have a hard mask (not shown) and the spacer created from layer 15 as an etch mask, layer 12b may be etched to the top of layer 13. Again, using patterned layer 14 and layer 15 (i.e. the first spacer) for the etch mask, layer 13 to the top of layer 11a may be removed using an etch process such as an anisotropic etch. Similarly, using layer 14 and layer 15 as an etch mask, etch layer 12a to the top of layer 11a. Layers 12b, 13 and 12a form channel 500 residing between the source/drain contact created from layer 11b and the source/drain layer, 11a. Channel 500 may be composed of semiconductor layers 12a and 12b and semiconductor layer 13. Layer 13 is composed of different semiconductor material (i.e. the third semiconductor material) with a greater bandgap than the second semiconductor material which composes layers 12a and 12b. In the exemplary embodiment, layer 13 forms the barrier used in channel 500 to reduce loft. The channel thickness may be in the range of 5 nm to 50 nm.

Figure 6:
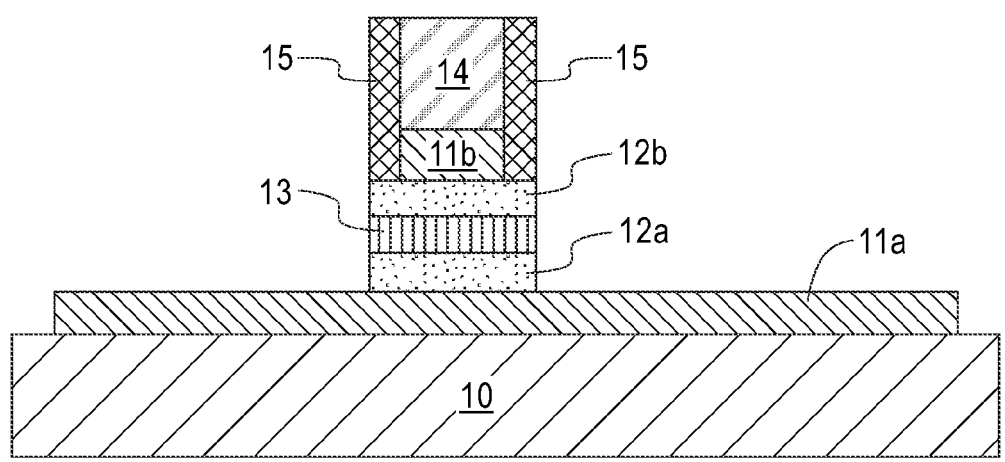
FIG. 6 depicts a cross-sectional view of the wafer after fabrication steps to form a source/drain contact in accordance with an embodiment of the present invention.

FIG. 6 depicts a cross-sectional view of the wafer after fabrication steps to form a source/drain contact in accordance with an embodiment of the present invention. Using photolithography, layer 11a may be selectively patterned and etched to the top of layer 10, or in other words, to the semiconductor substrate. In an exemplary embodiment, layer 11a is etched in a rectangular shape as shown, forming a mesa on the semiconductor substrate. As patterned, layer 11a may be used as a first source/drain contact. In the exemplary embodiment, layer 11a may have patterned dimensions in the range of 50 nm to 500 nm in length and 50 nm to 500 nm in width. However, in other embodiments, layer 11a may have different dimensions. In an embodiment, layer 11a may be patterned to a different shape, for example, a circle.

Figure 7:
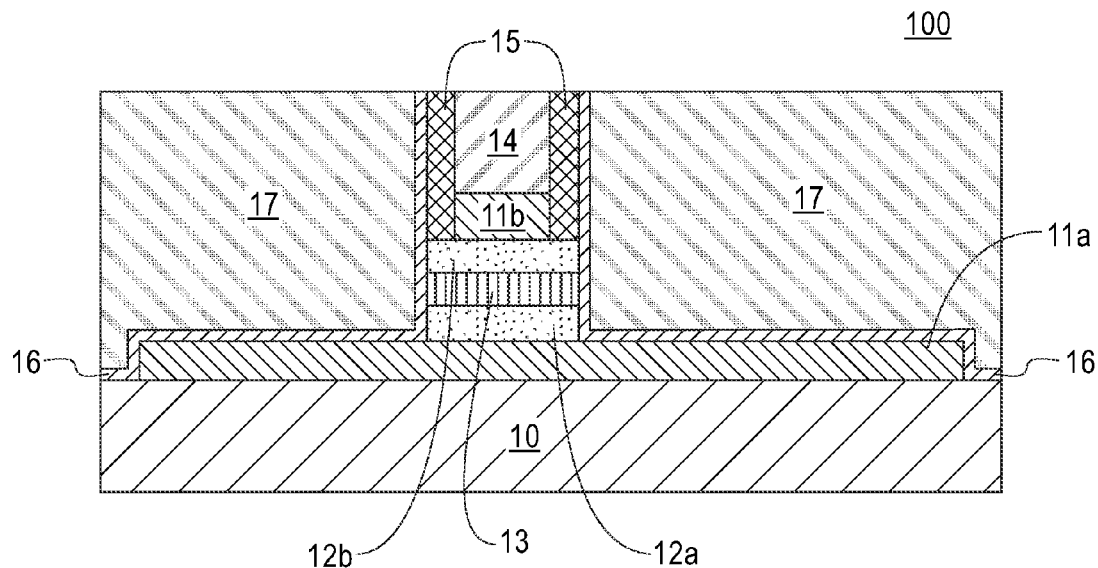
FIG. 7 depicts a cross-sectional view of the wafer after fabrication steps to deposit a gate electrode layer in accordance with an embodiment of the present invention.

FIG. 7 depicts a cross-sectional view of the wafer after fabrication steps to deposit a gate layer in accordance with an embodiment of the present invention. A conformal gate dielectric layer, layer 16, may be deposited on the sides of the channel 500, composed of layers 12a, 13, 12b and layer 15, on the top of layer 14, layer 15, on a portion of layer 11a, and on a portion of the semiconductor substrate top surface (i.e. layer 10) using a suitable deposition technique including, but not limited to chemical vapor deposition (CVD), plasma enhanced chemical vapor deposition (PECVD), atomic layer deposition (ALD), physical vapor deposition (PVD), or other similar deposition processes. In the exemplary embodiment, ALD is used for gate dielectric deposition. In another embodiment, CVD is used for depositing layer 16. Layer 16 may be composed of any appropriate gate dielectric material. In an embodiment, $SiO_2$ may be used as a gate dielectric. In an exemplary embodiment, layer 16 may be composed of high-k dielectric materials which may have a relative dielectric constant greater than four such as $HfO_2$. For example, $ZrO_2$, $Al_2O_3$, $TiO_2$, $LaAlO_3$, $HfSiO_2$, $SrTiO_3$, $Y_2O_3$, or other similar dielectric material may be used as the gate dielectric material in layer 16. In the exemplary embodiment, the gate dielectric layer or layer 16 has a thickness in the range of 1 nm to 20 nm. However, in other embodiments, the gate dielectric layer thickness may be less than 1 nm while in an embodiment, the gate dielectric layer thickness may be greater than 20 nm. In an embodiment, high-k dielectrics are used for the gate dielectric layer with III-V semiconductors channel materials (e.g. NFETs). In another embodiment, high-k dielectrics are used for a thin gate dielectric layer with other semiconductor channel materials (e.g. Si or SiGe in PFETs). A thin gate dielectric layer may be less than 10 nm, for example.

In the exemplary embodiment, a gate electrode layer depicted as layer 17 is deposited on the gate dielectric layer (i.e. layer 17 covers layer 16). The gate electrode layer or layer 17 may be deposited by a known deposition method such as MBE, CVD, PECVD, ALD, PVD or other similar deposition methods. Layer 17 may be any suitable conductive material for a gate electrode. In the exemplary embodiment, the gate electrode is formed from layer 17 which may be titanium nitride. In an embodiment, the gate electrode may be one of the following metals: tungsten, tantalum, tantalum nitride, platinum, or gold. In another embodiment, the gate electrode or gate may be other conductive materials, for example, polysilicon, polysilicon germanium, polygermanium, conductive metal alloys, conductive nitrides, conductive oxides, and similar conductive materials or combination of conductive materials or layers. In some embodiments, the gate or gate electrode consisting of polysilicon, polysilicon germanium, or polygermanium may be doped with doping materials such as aluminum, boron, arsenic, phosphorous, antimony, gallium, or mixtures thereof.

In an exemplary embodiment, a CMP is performed on the gate electrode, layer 17, stopping when reaching layer 14 and layer 15, the first dielectric layer and the spacer, respectively. In some embodiments, gate dielectric layer, layer 16 may be removed from the top surfaces of layer 14 and layer 15 by CMP.

Figure 8:
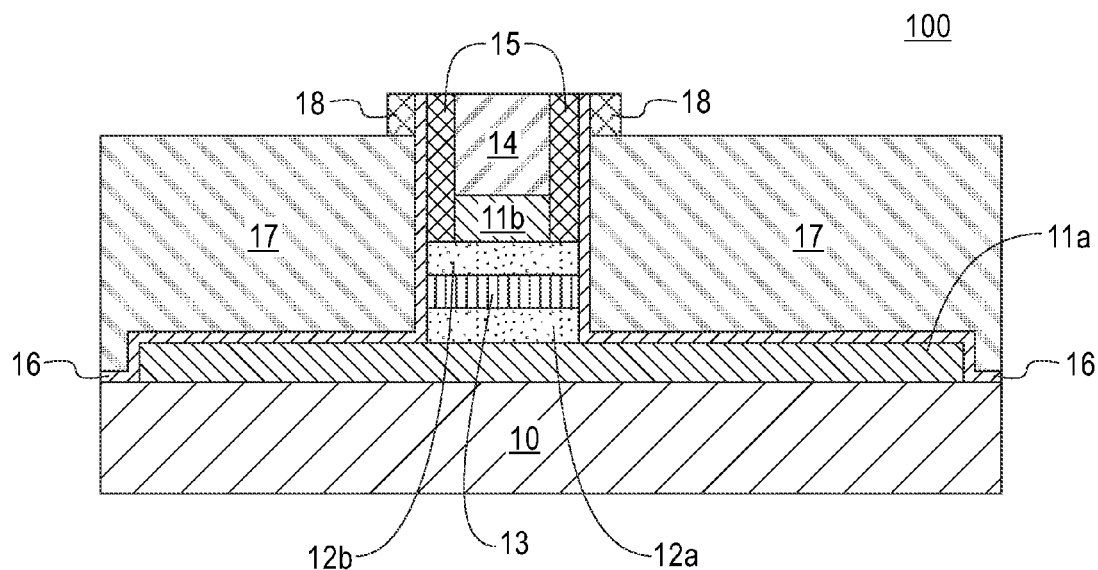
FIG. 8 depicts a cross-sectional view of the wafer after fabrication steps to form a second spacer in accordance with an embodiment of the present invention.

FIG. 8 depicts a cross-sectional view of the wafer after fabrication steps to form a second spacer in accordance with an embodiment of the present invention. A timed etch using a wet etch or RIE, for example, of the gate electrode of layer 17 lowers the gate electrode top surface below the top surface of the first spacer formed from layer 15. In the exemplary embodiment, the gate electrode of layer 17 is etched 5 nm to 50 nm below the top surface of layer 15. In an embodiment, the gate electrode of layer 17 may be recessed to a different depth below the top surface of layer 15.

A third dielectric layer, layer 18 may be deposited on the top surface of the gate electrode of layer 17. The third dielectric layer deposited by a known deposition method such as MBE, CVD, PECVD, ALD, PVD, or other similar dielectric deposition process. The third dielectric layer, layer 18, may be composed of a $SiO_2$ dielectric material in the exemplary embodiment. The third dielectric material may also be a dielectric material such as SiN, SiON, or a high-K dielectric. In an embodiment, the third dielectric material may be the same dielectric material as the first dielectric material but, it may not be the same material as the second dielectric. In one embodiment, a CMP may be performed on the top surface of layer 18 to form a planar surface.

Layer 18 may be etched with a suitable etch process to form the second spacer. The second spacer composed of the third dielectric material of layer 18 wraps around the gate dielectric (i.e. layer 16), the first spacer composed of layer 15, and first dielectric layer, layer 14. In the exemplary embodiment, the second spacer made from layer 18 forms a ring around the gate dielectric layer which is layer 16. In the exemplary embodiment, the width of the second spacer formed from layer 18 is in the range of 5 nm to 50 nm. In other embodiments, the width of the second spacer may be different. For example, the width of the second spacer could be less than 5 nm. In an embodiment, the shape of the second spacer may be different. For example, the second spacer may be a box.

Figure 9:
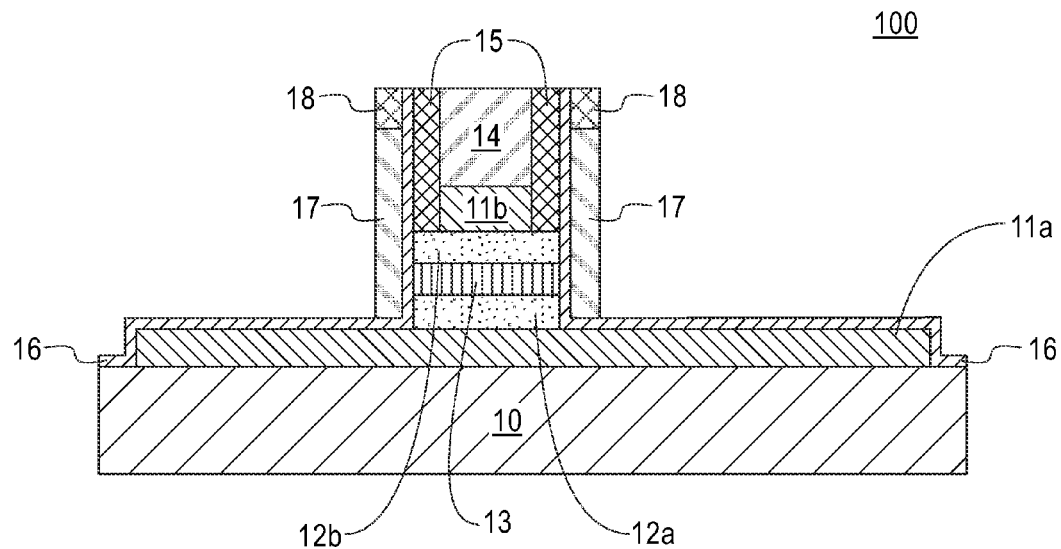
FIG. 9 depicts a cross-sectional view of the wafer after fabrication steps to form a gate in accordance with an embodiment of the present invention.

FIG. 9 depicts a cross-sectional view of the wafer after fabrication steps to form a gate in accordance with an embodiment of the present invention. In the exemplary embodiment, the gate electrode, layer 17, is etched using an reactive ion etch (RIE) using the dielectric layers, layer 14, layer 15 and layer 18 and gate dielectric layer 16 as etch masks. Layer 17, the gate electrode, wraps around gate dielectric layer 16 which surrounds or wraps around layer 15, channel 500 (e.g. layer 12*a*, layer 13, and layer 12*b*) and the gate electrode residing on a portion of gate dielectric layer 16 which is over a portion of layer 11*a* (e.g. source/drain contact or mesa).

Figure 10:
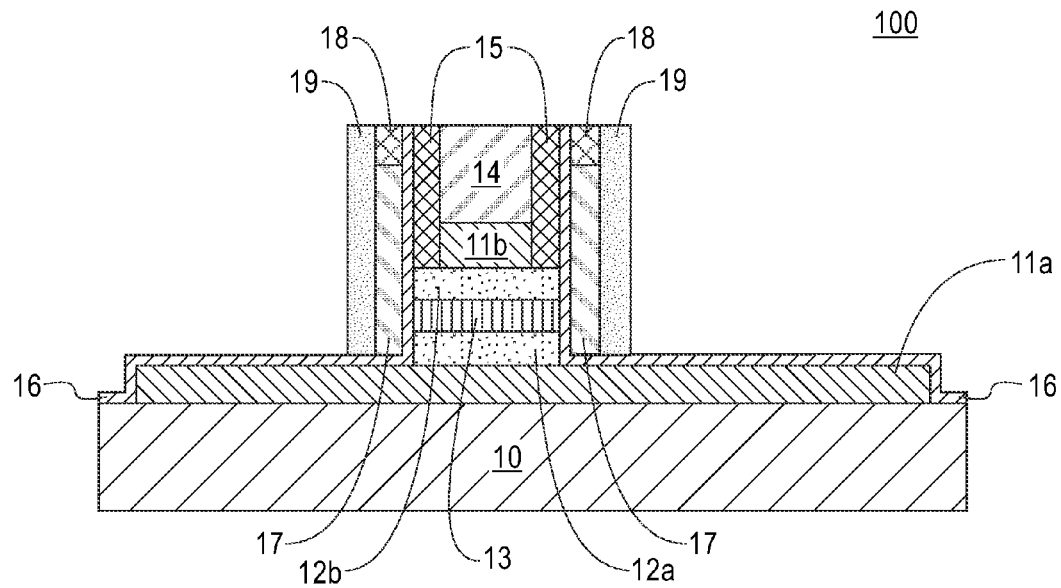
FIG. 10 depicts a cross-sectional view of the wafer after fabrication steps to form a third spacer in accordance with an embodiment of the present invention.

FIG. 10 depicts a cross-sectional view of the wafer after fabrication steps to form a third spacer in accordance with an embodiment of the present invention. A layer of a fourth dielectric layer, layer 19, may be deposited using known deposition techniques such as MBE, CVD, or other suitable deposition process. In an embodiment, layer 19 may be deposited using a conformal deposition. Layer 19 may be deposited over the gate dielectric layer adjacent to the gate electrode (i.e. layer 17) and the second spacer, layer 18. Layer 19 is etched with a suitable process such as an anisotropic etch to remove the fourth dielectric material from the horizontal surfaces to form the third spacer.

Layer 19 may be composed of a fourth dielectric material. In an embodiment, the fourth dielectric of layer 19 may be the same as the second dielectric material. However, the fourth dielectric material may be not the same material as the first dielectric material or the third dielectric material. In another embodiment, the fourth dielectric material may be another dielectric such as SiN. In the exemplary embodiment, the fourth dielectric material may be a high-k dielectric material, for example, hafnium silicate or hafnium oxide. In one embodiment, a CMP process may be used to form a planar surface for layer 19. Layer 19 may be etched using a suitable etch process, for example, RIE, to the top of the gate dielectric layer (i.e. layer 16). The third spacer composed of the fourth dielectric material wraps around the gate electrode (layer 17) and the second spacer (i.e. layer 18). The thickness of layer 19 may be in the range of 5 nm to 50 nm.

Figure 11:
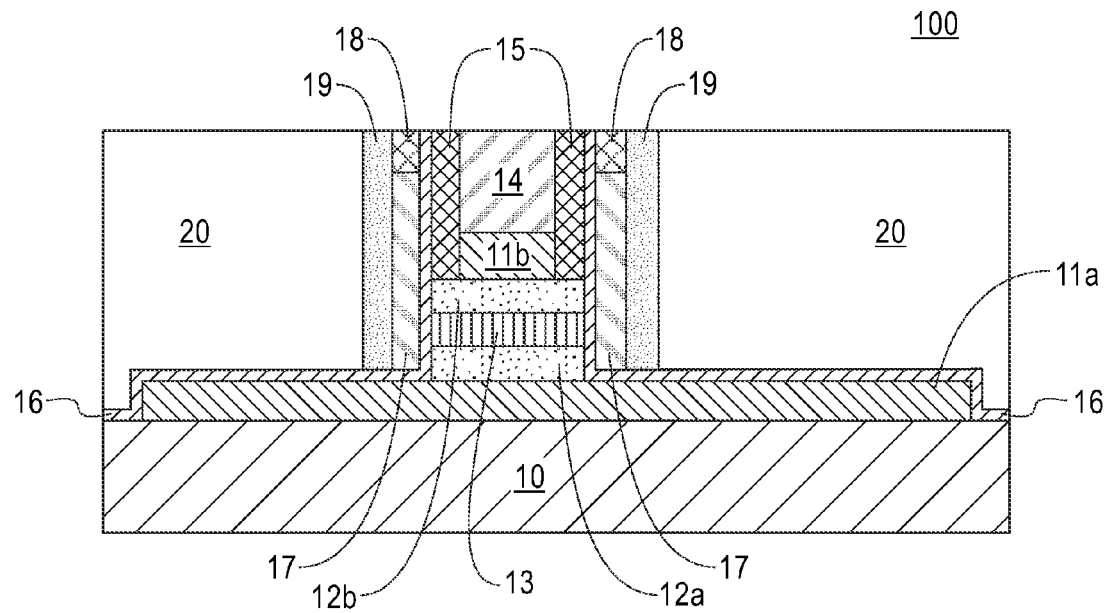
FIG. 11 depicts a cross-sectional view of the wafer after fabrication steps to form an interlayer dielectric ("ILD") in accordance with an embodiment of the present invention.

FIG. 11 depicts a cross-sectional view of the wafer after fabrication steps to form an interlayer dielectric in accordance with an embodiment of the present invention. Layer 20 is an interlayer dielectric (ILD) which is deposited over the gate dielectric layer, layer 16 and abutting the third spacer, layer 19. The ILD which is layer 20 may be deposited using suitable deposition processes. In an embodiment, layer 20 may be composed of a dielectric material such as SiO2, but, may be composed of different ILD materials in other embodiments. A CMP process may be performed on layer 20, stopping on the top surface of layers 18 and 19.

Figure 12:
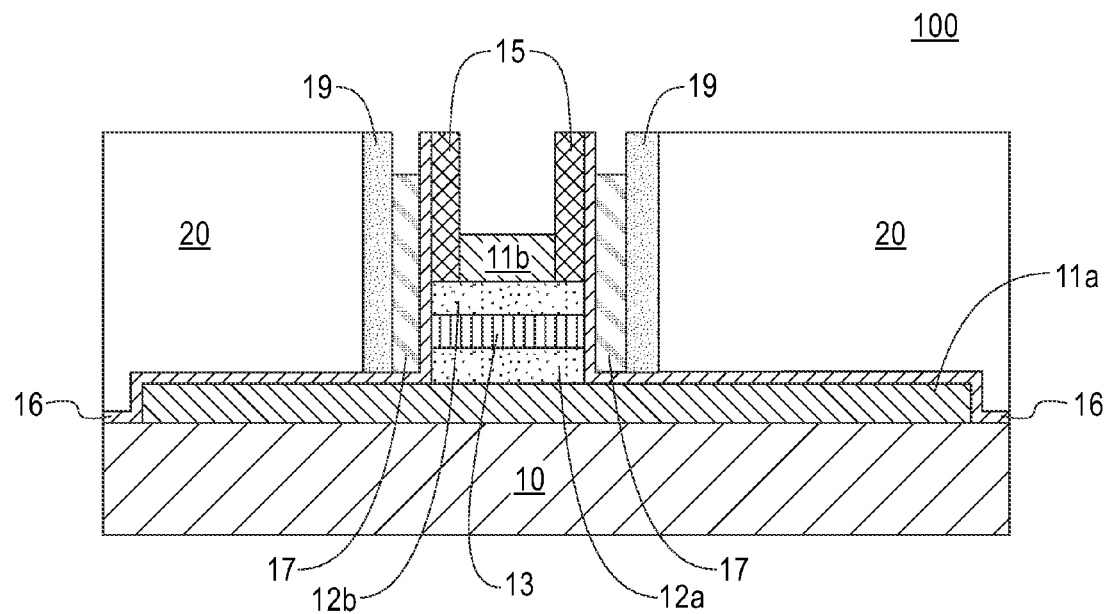
FIG. 12 depicts across-sectional view of the wafer after fabrication steps to selectively remove dielectric layers in accordance with an embodiment of the present invention.

FIG. 12 depicts a cross-sectional view of wafer 100 after fabrication steps to selectively remove dielectric layers in accordance with an embodiment of the present invention. A selective etch of layer 14 and layer 18 may be performed. Using known etch processes, such as RIE or a chemical etch, the first dielectric material of layer 14 and the third dielectric material of layer 18 may be removed from the wafer 100. The etch processes must be selective to layer 14 and layer 18 while inert or unreactive with other exposed dielectric materials, such as, layer 15 (the second dielectric material), layer 19 (the fourth dielectric material), and layer 20 (the inter layer dielectric).

Figure 13A:
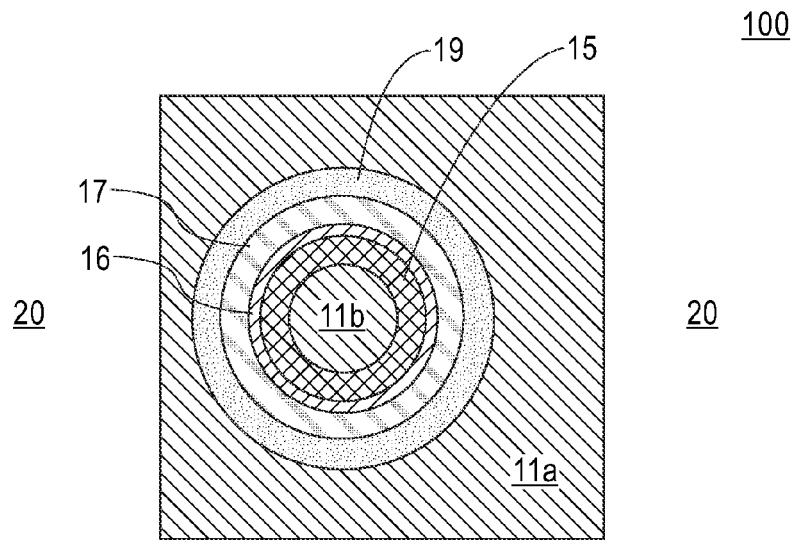
FIG. 13a is a top view of the wafer created using the steps presented in FIGS. 2-12 after selectively removing the ILD and a gate dielectric layer in accordance with an embodiment of the present invention.

FIG. 13a is a top view of wafer 100 created using the step presented in FIGS. 2-12 after selectively removing the ILD and the gate dielectric layer in accordance with an embodiment of the present invention. Using conventional lithography techniques, apply resist and selectively etch ILD (i.e. layer 20) and the gate dielectric layer (i.e. layer 16) from the exposed areas. The ILD and the gate dielectric layer may be removed from a rectangular area outside of layer 19. Upon removal of the ILD and gate dielectric layer, the source/drain contact areas illustrated in FIG. 13a as layer 11a and layer 11b may be exposed below the top surface of wafer 100 along with layer 17 previously removed.

Figure 13B:
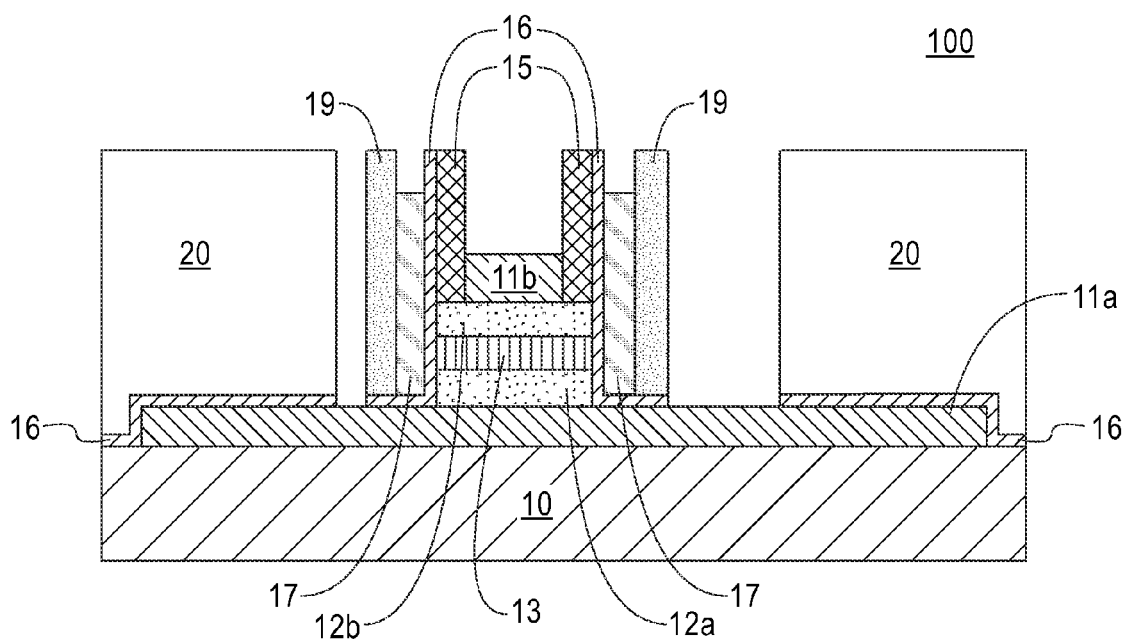
FIG. 13b depicts a cross-sectional view of the wafer after fabrication steps to selectively remove the ILD material and the gate dielectric layer in accordance with an embodiment of the present invention.

FIG. 13b depicts across-sectional view of wafer 100 after fabrication steps to selectively remove the ILD material and the gate dielectric layer in accordance with an embodiment of the present invention. FIG. 13b depicts the cross-sectional view of wafer 100 after removing the portion of the ILD material exposed for etch. The ILD and a portion of the gate dielectric layer beneath the exposed ILD material may be removed exposing layer 11a and a portion of layer 11b.

Figure 14:
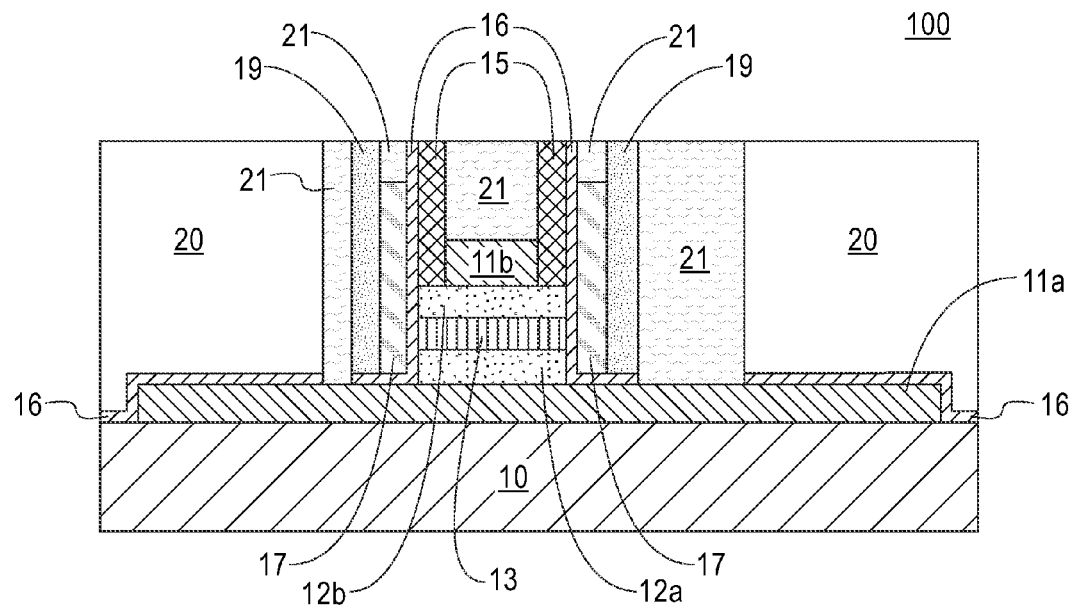
FIG. 14 depicts a cross-sectional view of the wafer after fabrication steps to deposit a contact metal in accordance with an embodiment of the present invention.

FIG. 14 depicts a cross-sectional view of wafer 100 after fabrication steps to deposit a contact metal in accordance with an embodiment of the present invention. Layer 21 may be composed of any suitable contact metal. In an embodiment, the contact metal of layer 21 may be tungsten. In another embodiment, the contact metal may be layered, such as TiN layered with tungsten or any other suitable backend of line (BEOL) contact metal such as copper, or another contact material, or layered contact materials. Layer 21 may be deposited using a suitable deposition process on layer 11a and layer 11b which are the source/drain contacts and over the gate electrode, layer 17. The contact metal which includes a gate contact on a portion of the gate electrode, a first metal contact on the second source/drain contact and a second metal on the first source/drain contract. A CMP may be performed on layer 21, stopping on the top surface of layers 15, 19 and 20.

Figure 15:
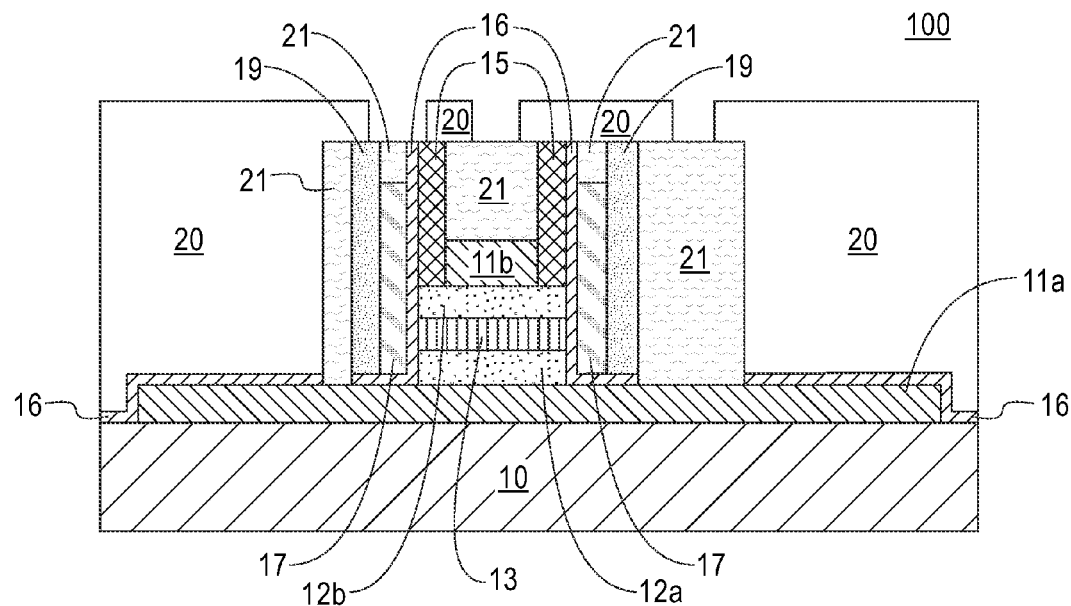
FIG. 15 depicts a cross-sectional view of the wafer after fabrication steps to deposit and pattern another layer of ILD material in accordance with an embodiment of the present invention.

FIG. 15 depicts a cross-sectional view of wafer 100 after fabrication steps to deposit and pattern another layer of ILD material in accordance with an embodiment of the present invention. Using known methods, a second layer of ILD material (e.g. layer 20) may be deposited on the top surface of wafer 100. Using BEOL lithography processes, selectively etch the second layer of ILD material to the top of a portion of layers 15, 16, 19 and 21 using a suitable etch process to form metal layer 1 (M1) vias in the ILD material.

Figure 16A:
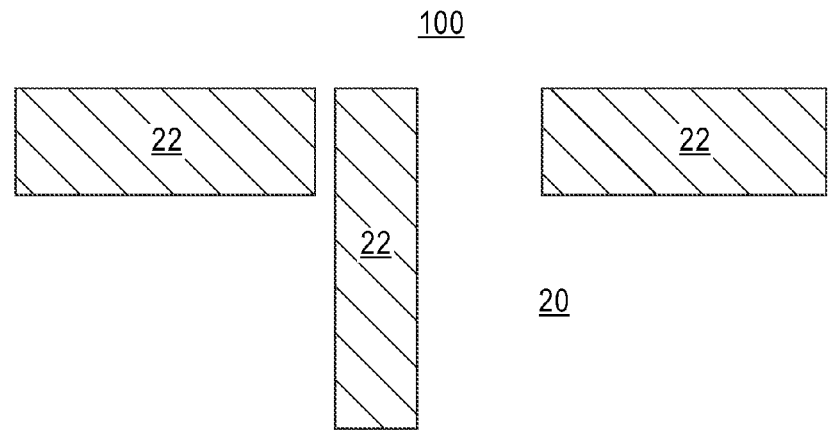
FIG. 16a is a top view of the wafer created using the steps presented in FIGS. 2-15 after a chemical mechanical polish process in accordance with an embodiment of the present invention.

FIG. 16a depicts a top view of wafer 100 created using the steps presented in FIGS. 2-15 after a chemical mechanical polish process in accordance with an embodiment of the present invention. Layer 22 is composed of M1 metal such as tungsten, copper or similar conductive metal and forms M1 lines as depicted. Layer 20 may be the ILD material used in wafer 100.

Figure 16B:
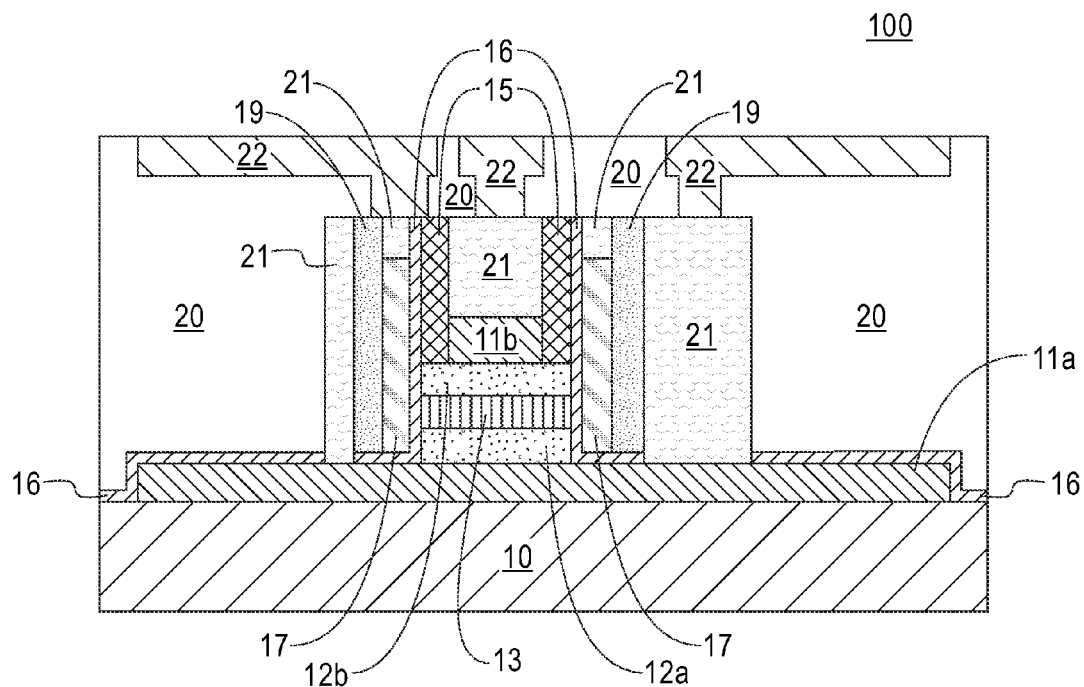
FIG. 16b depicts a cross-sectional view of the wafer after fabrication steps performing a chemical mechanical polish, in accordance with an embodiment of the present invention.

FIG. 16b depicts across-sectional view of wafer 100 after fabrication steps to perform a chemical mechanical polish in accordance with an embodiment of the present invention. Another layer of ILD material may be deposited on the top surface of wafer 100. The third layer of ILD material (i.e. layer 20) may be selectively removed for metal layer (M1) using an etch process, for example, a wet etch or RIE. The third ILD material may be removed from a portion of layer 20 and over the area of the second layer of ILD removed as shown in FIG. 15. The metal layer (M1) may be deposited using BEOL processes. M1 metal depicted as layer 22 may be deposited using known processes on the top surface of wafer 100. A CMP to the top surface of wafer 100 removes the excess ILD material of layer 20 and the excess M1 metal of layer 22 to form M1 lines. M1 lines, composed of conventional BEOL materials such as tungsten or copper, may be formed after CMP. FIG. 16b depicts a vertical FET with M1 lines.

In some embodiments, the wafers formed by the embodiments of the present invention may be diced in semiconductor chip form. The resulting semiconductor chips can be distributed by the fabricator in raw wafer form (that is, as a single wafer that has multiple unpackaged chips), as a bare die or in a packaged form. In the latter case, the chip is mounted in a single chip package (such as a plastic carrier, with lead that is affixed to a motherboard or other higher level carrier) or in a multichip package (such as a ceramic carrier that has either or both surface interconnections or buried interconnections). In any case the chip is then integrated with other chips, discreet circuit elements, and motherboard or (b) end product. The end product can be any product that includes integrated circuit chips, ranging from toys and other low-end applications to advanced computer products having a display, a keyboard or other input device and a central processor.

What is claimed is:

1. A method of forming a barrier in a vertical field effect transistor with low effective mass channel materials, comprising:
    forming a first source/drain contact on a semiconductor substrate;
    forming a channel with a first channel layer on the first source/drain contact, a barrier on the first channel layer, and a second channel layer on the barrier;
    forming a second source/drain contact on the second channel layer;
    patterning a first dielectric layer and the second source/drain contact on the second channel layer to form a first pillar;
    forming a first spacer on the second channel layer, the first spacer surrounding the second source/drain contact and the first dielectric layer;
    patterning the second channel layer, the barrier, and the first channel layer to form a second pillar, the second pillar including the first spacer, the second source/drain contact, and the first dielectric layer;
    depositing a gate dielectric layer covered by a gate electrode layer over a portion of the semiconductor substrate, a portion of the first source/drain contact, around the second pillar, and over the second pillar;
    forming a second spacer;
    forming a gate electrode from the gate electrode layer;
    forming a third spacer adjacent to the second pillar on the gate dielectric layer, the gate dielectric layer being on a portion of the first source/drain contact;

depositing an interlayer dielectric layer over the gate dielectric layer and adjacent to the third spacer; and depositing a contact metal to form metal contacts by selectively removing the first dielectric layer, the second spacer, a portion of the interlayer dielectric layer, and a portion of the gate dielectric layer under the removed portion of the interlayer dielectric layer.

2. The method of claim 1, wherein forming the first source/drain contact, the first channel layer, the barrier, the second channel layer, and the second source/drain contact includes epitaxial growth of a semiconductor material and an etch process.

3. The method of claim 1, wherein the barrier is formed from a barrier semiconductor material having an electron affinity less than the electron affinity of the first channel layer for a n-channel field effect transistor.

4. The method of claim 1, wherein the barrier is formed from a barrier semiconductor material having a combined electron affinity and bandgap that is greater than the combined electron affinity and bandgap of the first channel layer in a p-channel field effect transistor.

5. The method of claim 3, wherein the barrier in the n-channel field effect transistor is formed from the barrier semiconductor material which is a group III-V semiconductor.

6. The method of claim 4, wherein the barrier in the p-channel field effect transistor formed from the barrier semiconductor material is one of: a group IV semiconductor material and a group IV compound semiconductor material in a p-type field effect transistor.

* * * * *